US007425877B2

(12) United States Patent
Casper et al.

(10) Patent No.: US 7,425,877 B2
(45) Date of Patent: Sep. 16, 2008

(54) LANGE COUPLER SYSTEM AND METHOD

(75) Inventors: Michael D. Casper, Nashua, NH (US); William B. Mraz, Newfield, NH (US)

(73) Assignee: UltraSource, Inc., Hollis, NH (US)

( * ) Notice: Subject to any disclaimer, the term of this patent is extended or adjusted under 35 U.S.C. 154(b) by 336 days.

(21) Appl. No.: 11/090,354

(22) Filed: Mar. 26, 2005

(65) Prior Publication Data

US 2005/0162236 A1    Jul. 28, 2005

Related U.S. Application Data

(63) Continuation-in-part of application No. 10/686,128, filed on Oct. 15, 2003, now Pat. No. 6,890,629, which is a continuation-in-part of application No. 09/960,796, filed on Sep. 21, 2001, now Pat. No. 6,761,963.

(51) Int. Cl.
*H01P 5/12* (2006.01)

(52) U.S. Cl. .................................. 333/116; 333/238

(58) Field of Classification Search ................ 333/116, 333/238, 246
See application file for complete search history.

(56) References Cited

U.S. PATENT DOCUMENTS

| | | |
|---|---|---|
| 3,969,197 A | 7/1976 | Tolar et al. |
| 4,002,542 A | 1/1977 | Young |
| 4,002,545 A | 1/1977 | Fehiner et al. |
| 4,038,167 A | 7/1977 | Young |
| 4,062,749 A | 12/1977 | Young |
| 4,364,099 A | 12/1982 | Koyama et al. |
| 4,408,254 A | 10/1983 | Chu et al. |
| 4,410,867 A | 10/1983 | Arcidiacono et al. |
| 4,423,087 A | 12/1983 | Howard et al. |
| 4,471,405 A | 9/1984 | Howard et al. |
| 4,599,678 A | 7/1986 | Wertheimer et al. |
| 4,631,633 A | 12/1986 | Shaulov et al. |

(Continued)

OTHER PUBLICATIONS

Marc De Samber, Nick Pulsford, Marc Van Delden, Robert Milsom; "Low-Complexity MCM-D Technology with Integrated Passives for High Frequency Applications", The International Journal of Microcircuits and Electronic Packaging, vol. 21, No. 2, Second Quarter 1998, pp. 226-229 (ISSN 1063-1674) (International Microelectronics and Packaging Society) [6 pages].

*Primary Examiner*—Dean O Takaoka
(74) *Attorney, Agent, or Firm*—Hayes Soloway PC

(57) ABSTRACT

A system and method for the fabrication of high reliability high performance Lange couplers (optionally including capacitors (1011), inductors (1012), multi-layer interconnects (1013), and resistors (1014)) on various thin film hybrid substrate surfaces (0501) is disclosed. The disclosed Lange coupler method first employs a thin metal layer (0502) deposited and patterned on the substrate (0501). This thin patterned layer (0502) is used to provide both lower electrodes for capacitor structures (0603) and interconnects (0604) between upper electrode components. Next, a dielectric layer (0705) is deposited over the thin patterned layer (0502) and the dielectric layer (0705) is patterned to open contact holes (0806) to the thin patterned layer. The upper electrode layers (0907, 0908, 1009, 1010) are then deposited and patterned on top of the dielectric (0705). The resulting Lange coupler structure has significantly improved electrical performance over the prior art, while incorporating overall structural integrity superior to that of the prior art.

34 Claims, 13 Drawing Sheets

U.S. PATENT DOCUMENTS

| | | |
|---|---|---|
| 4,937,541 A | 6/1990 | Podell et al. |
| 5,105,171 A | 4/1992 | Wen et al. |
| 5,122,923 A | 6/1992 | Matsubara et al. |
| 5,258,886 A | 11/1993 | Murayama et al. |
| 5,262,920 A | 11/1993 | Sakuma et al. |
| 5,313,175 A * | 5/1994 | Bahl et al. .................. 333/116 |
| 5,338,950 A | 8/1994 | Bahl |
| 5,382,817 A | 1/1995 | Kashihara et al. |
| 5,390,072 A | 2/1995 | Anderson et al. |
| 5,436,477 A | 7/1995 | Hashizume et al. |
| 5,455,064 A | 10/1995 | Chou et al. |
| 5,539,613 A | 7/1996 | Yamamichi et al. |
| 5,587,870 A | 12/1996 | Anderson et al. |
| 5,643,804 A | 7/1997 | Arai et al. |
| 5,670,408 A | 9/1997 | Yamamichi et al. |
| 5,685,968 A | 11/1997 | Hayakawa et al. |
| 5,693,595 A | 12/1997 | Talisa et al. |
| 5,699,224 A | 12/1997 | Hanamura et al. |
| 5,708,302 A | 1/1998 | Azuma et al. |
| 5,736,448 A | 4/1998 | Saia et al. |
| 5,737,179 A | 4/1998 | Shaw et al. |
| 5,741,722 A | 4/1998 | Lee |
| 5,745,335 A | 4/1998 | Watt |
| 5,760,432 A | 6/1998 | Abe et al. |
| 5,767,564 A | 6/1998 | Kunimatsu et al. |
| 5,781,081 A | 7/1998 | Arakawa et al. |
| 5,789,323 A | 8/1998 | Taylor |
| 5,818,079 A | 10/1998 | Noma et al. |
| 5,822,175 A | 10/1998 | Azuma |
| 5,834,991 A | 11/1998 | Mazzochette |
| 5,872,040 A | 2/1999 | Wojnarowski et al. |
| 5,874,379 A | 2/1999 | Joo et al. |
| 5,877,533 A | 3/1999 | Arai et al. |
| 5,882,946 A | 3/1999 | Otami |
| 5,883,781 A | 3/1999 | Yamamichi et al. |
| 5,889,299 A | 3/1999 | Abe et al. |
| 5,907,470 A | 5/1999 | Kita et al. |
| 5,912,044 A | 6/1999 | Farooq et al. |
| 5,936,831 A | 8/1999 | Kola et al. |
| 5,943,547 A | 8/1999 | Yamamichi et al. |
| 5,955,774 A | 9/1999 | Kang |
| 5,973,908 A | 10/1999 | Saia et al. |
| 5,973,911 A | 10/1999 | Nishioka |
| 5,982,018 A | 11/1999 | Wark et al. |
| 6,001,702 A | 12/1999 | Cook et al. |
| 6,023,407 A | 2/2000 | Farooq et al. |
| 6,023,408 A | 2/2000 | Schaper |
| 6,040,594 A | 3/2000 | Otani |
| 6,069,388 A | 5/2000 | Okusa et al. |
| 6,072,205 A | 6/2000 | Yamaguchi et al. |
| 6,075,691 A | 6/2000 | Duenas et al. |
| 6,078,093 A | 6/2000 | Lee |
| 6,081,417 A | 6/2000 | Matsuki |
| 6,096,600 A | 8/2000 | Azami |
| 6,761,963 B2 | 7/2004 | Casper et al. |
| 2002/0089810 A1 | 7/2002 | Casper et al. |
| 2004/0080021 A1 | 4/2004 | Casper et al. |
| 2004/0081811 A1 | 4/2004 | Casper et al. |

* cited by examiner

*Prior Art*

FIG. 8A
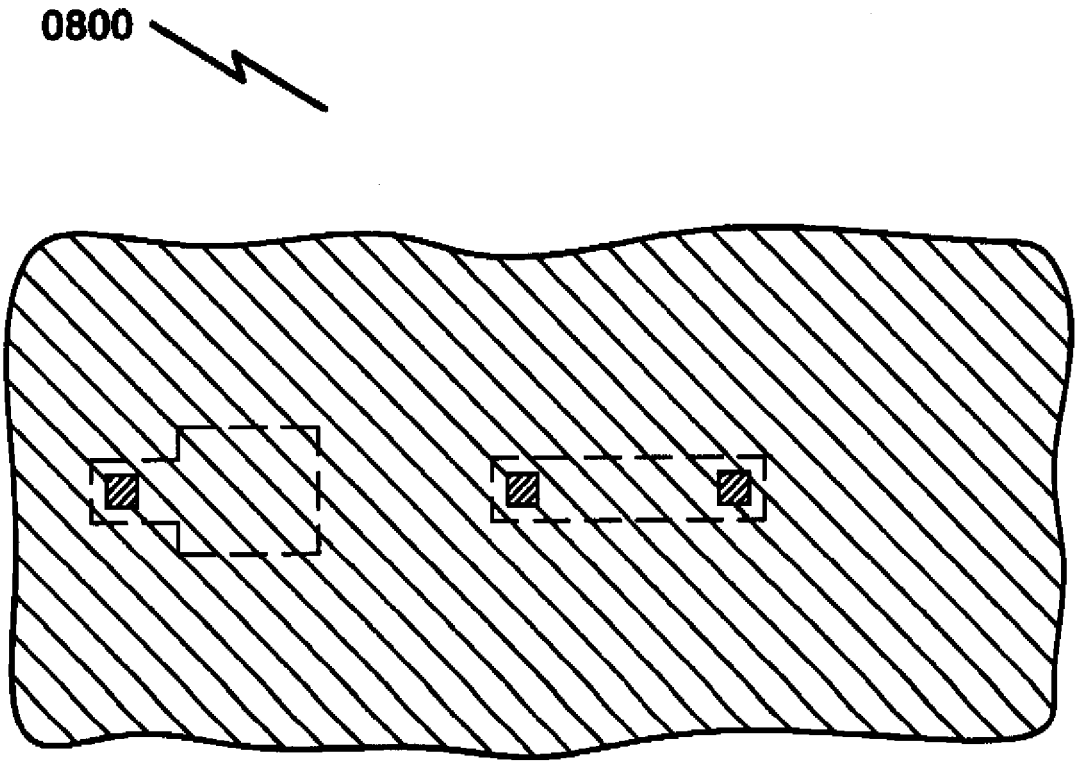
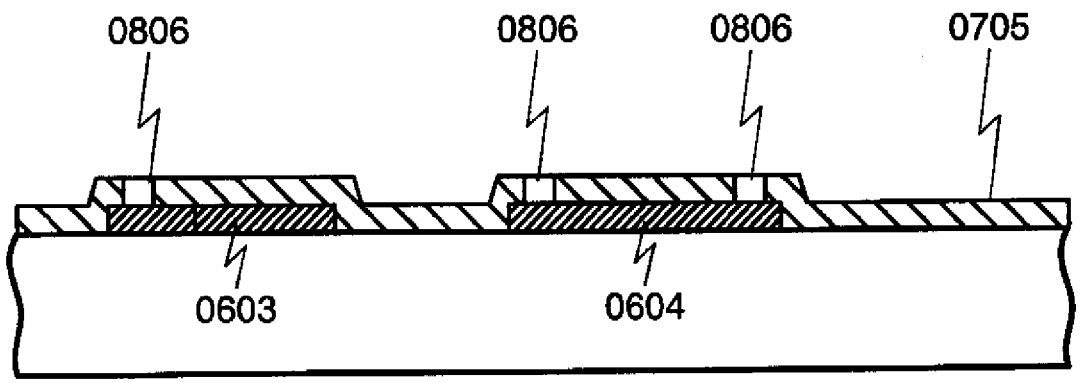
FIG. 8B

1500

1501

1502

1503

LANGE COUPLER SYSTEM AND METHOD

CROSS REFERENCE TO RELATED APPLICATIONS

Utility Patent Applications

This patent application is a continuation-in-part Utility Patent Application for "INTEGRATED THIN FILM CAPACITOR/INTERCONNECT SYSTEM AND METHOD", Ser. No. 10/686,128, filed Oct. 15, 2003, now U.S. Pat. No. 6,890,629. Applicants incorporate this parent application by reference and claim benefit pursuant to 35 U.S.C. § 120 for this previously filed patent application.

U.S. Pat. No. 6,890,629 (Ser. No. 10/686,128) was a continuation-in-part Utility Patent Application for "INTEGRATED THIN FILM CAPACITOR/INTERCONNECT SYSTEM AND METHOD", Ser. No. 09/960,796, filed Sep. 21, 2001, now U.S. Pat. No. 6,761,963. Applicants incorporate this parent application by reference and claim benefit pursuant to 35 U.S.C. § 120 for this previously filed patent application.

Provisional Patent Applications

Applicant claims benefit pursuant to 35 U.S.C. § 119 and hereby incorporates by reference Provisional Patent Application for "INTEGRATED THIN FILM CAPACITOR/INTERCONNECT SYSTEM AND METHOD", Ser. No. 60/234,135, filed Sep. 21, 2000, and submitted to the USPTO with Express Mail Label EM267139965US.

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO A MICROFICHE APPENDIX

Not Applicable

FIELD OF THE INVENTION

The present invention provides a system and method for fabricating Lange couplers on hybrid microelectronic substrate surfaces using thin film technology. Specifically, it employs a thin lower bridge conducting electrode layer under a patterned dielectric layer. Conventional thin film conductors are then deposited on top of the dielectric layer to form integrated high performance Lange coupler structures on the same device.

BACKGROUND OF THE INVENTION

Hybrid microelectronic devices such as Lange couplers have been conventionally manufactured on a variety of substrate materials using various techniques such as thick film, low temperature co-fired ceramic (LTCC), and thin film technology. Hybrid devices are used in many microelectronics applications in the defense, medical, communications, computer, automotive, and infrared imaging industries, as well as in many other applications. In all of these industries there is continuous demand for devices that offer improved performance and function, especially at higher electrical frequencies. In order to satisfy these demands, the number of passive devices (capacitors, inductors, and resistors) designed into microelectronic devices continues to grow. For instance, a typical cellular phone product may contain 400 components, with less than 20 devices being active (i.e., semiconductors) and the 380 or more devices being passive devices.

Along with demands for better performance are also requirements to provide products that are less expensive and smaller in size. It is reported that the passive components in a cellular phone product can occupy 80% of the printed circuit board area and account for 70% of the product assembly costs. Thus, there is clear need to reduce the size and cost of the passive devices required in microelectronic devices.

Of the hybrid circuit fabrication techniques, thin film technology is extremely well suited for use in RF/microwave, wireless, and optical transmission technologies because of its ability to provide high quality features, extremely dense packaging, and a large range of integrated features.

The current state of the art in thin film hybrid microelectronic manufacturing offers cost effective, high reliability methods for integrating conductors, inductors, and resistors onto the same thin film hybrid circuit device but not capacitors and interconnects (i.e. connections between devices and multiple layers).

Presently, capacitors are typically purchased individually and attached to the thin film devices using various surface mount die attach techniques. The individual chip capacitors take up valuable space, require much assembly labor, and can decrease reliability due to assembly problems.

Interconnects are often required to interconnect components and devices and to attach to the center of spiral inductors and power splitters such as Lange couplers. Current technology uses wire or ribbon bonding or air bridge type techniques to make individual interconnects. Wire or ribbon bonds can add higher costs and sometimes cause high frequency performance problems due to bond inconsistencies, different bond shapes or the bonds falling over and shorting to conductor lines that they are crossing over. Air bridges are expensive and difficult to produce because of their inherent complexity.

Thus, there is a clear need for a reliable fabrication method that offers both Lange couplers, capacitors, and integrated interconnects. It is especially desirable that this method provides features that are usable from DC to very high operating frequencies. The prior art does not satisfy this need.

A recent approach to the integration of capacitors and interconnects has concentrated on fabricating these devices on silicon wafers. See MARC DE SAMBER, NICK PULSFORD, MARC VAN DELDEN, ROBERT MILSOM; "Low-Complexity MCM-D Technology with Integrated Passives for High Frequency Applications", The International Journal of Microcircuits and Electronic Packaging, Volume 21, Number 2, Second Quarter 1998, pgs 224-229 (ISSN 1063-1674) (International Microelectronics and Packaging Society).

This paper presented simple concepts for fabricating integrated capacitors, inductors, resistors, and interconnects on silicon wafers. However, processing thin film hybrid substrates offers unique challenges when compared to silicon wafers, and the teachings presented in this prior art are not directly applicable to thin film hybrid substrate processing. Additionally, the integration of reliable Lange coupler structures that can be easily manufactured within this context has not been addressed by the prior art.

DESCRIPTION OF THE PRIOR ART

Overview

Two basic techniques have been used in the past to fabricate the "cross-overs" required to build Lange Couplers on integrated hybrid substrates. One technique is to use wire or ribbon bonds as the interconnects, the other technique is to use air bridges to connect the interdigitated fingers of a Lange coupler. Both techniques utilize "cross-overs" to provide interconnection within the Lange coupler structure. The wire bond technique is problematic because each bond has to be applied individually which can lead to reliability and tuning issues. The air bridge technique requires many process steps which leads to high product costs and decreased yields.

Wired Bridge Lange Coupler (0100)

FIG. 1A (0110) schematically illustrates a conventional prior art microstrip Lange coupler as detailed in the text MICROWAVE ENGINEERING, by David M. Pozar, ISBN 0-201-50418-9, 1990, page 431. This structure is schematically illustrated in FIG. 1A (0110) as having an INPUT PORT (0111), THROUGH PORT (0112), COUPLED PORT (0113), and ISOLATED PORT (0114).

A conventional prior art implementation of a Lange coupler is illustrated in FIG. 1B (0120), extracted from U.S. Pat. No. 5,834,991 issued to Joseph B. Mazzochette on Nov. 10, 1998. This structure requires one or more wire bridges or air bridges to implement the Lange coupler function. It is these bridges which present reliability and manufacturability problems in the prior art.

Unfolded Lange Coupler (0200)

FIG. 2 (0200) illustrates a conventional prior art microstrip unfolded Lange coupler as detailed in the text MICROWAVE ENGINEERING, by David M. Pozar, ISBN 0-201-50418-9, 1990, page 431. This structure requires one or more wire bridges or air bridges to implement the Lange coupler function. It is these bridges which present reliability and manufacturability problems in the prior art.

Lange Coupler with Crossover (0300)

Prior art MIM techniques implement a Lange coupler that uses air-bridges to crossover and connect the interdigitated fingers. This technique may use multiple deposition and patterning processes to build up and then cross over to the upper electrode layer.

This method exhibits manufacturing and repeatability problems due to its very complex nature. It is expensive and problematic to produce. It also suffers from reliability problems because the air bridges are vulnerable to collapsing and shorting from handling.

Air-Bridge Interconnects (0300)

In an effort to fabricate integrated interconnects, a "crossover" or "air-bridge" technique may be employed. This technique uses multiple deposition and patterning processes on a substrate to build up and then crossover thick conductor traces to form interconnects. The processes are typically expensive and therefore can usually only be used in high volume production or in specialty applications that are not cost sensitive. Additionally, the air-bridge spans are fragile and can be deformed or collapsed by simple handling. It is also important to note that due to the complex nature of the air-bridge process, it is extremely rare for air-bridge interconnects and air-bridge capacitors to be produced on the same device.

Air-Bridge Interconnects with Support (0400)

A more complex version of the simple air-bridge is to support the crossover span with an underlying insulating material, as described in U.S. Pat. No. 5,834,991 issued to Joseph B. Mazzochette on Nov. 10, 1998. Supported crossovers prevent the cross over span from being deformed and causing it to short to the conductor lines underneath. Usually polyimide is used as the supporting insulation.

The addition of the insulating support under the span increases the complexity and cost of the supported crossover process. It is again important to note that due to the complex nature of the supported air-bridge process, it is extremely rare for supported air-bridge interconnects and air-bridge capacitors to be produced on the same device.

Prior U.S. Patents

The prior art in this area relates generally to the following U.S. Pat. Nos. 3,969,197; 4,002,542; 4,002,545; 4,038,167; 4,062,749; 4,364,099; 4,408,254; 4,410,867; 4,423,087; 4,471,405; 4,599,678; 4,631,633; 5,122,923; 5,258,886; 5,262,920; 5,338,950; 5,390,072; 5,455,064; 5,539,613; 5,587,870; 5,643,804; 5,670,408; 5,685,968; 5,693,595; 5,699,224; 5,708,302; 5,736,448; 5,737,179; 5,745,335; 5,760,432; 5,767,564; 5,781,081; 5,818,079; 5,872,040; 5,874,379; 5,877,533; 5,882,946; 5,883,781; 5,889,299; 5,907,470; 5,912,044; 5,936,831; 5,943,547; 5,973,908; 5,973,911; 5,982,018; 6,001,702; 6,023,407; 6,023,408; 6,040,594; 6,069,388; 6,072,205; 6,075,691.

These patents generally address the following general areas:
1. Fabrication of Lange couplers on silicon wafers. Unfortunately, the manufacturing techniques utilized here are inapplicable to thin film hybrid substrate fabrication.
2. Fabrication of Lange couplers on thick film hybrid substrates. While these techniques do permit Lange coupler fabrication, the performance of these devices is limited and their manufacturing yield is generally low due to step coverage problems and/or problems with crossover bridge spans.
3. Fabrication of Lange couplers on thick film hybrid substrates using exotic plating techniques. These systems generally have high manufacturing costs and lower device performance than the present invention.

None of the prior art teaches the use of very thin metal patterns "under" the Lange couplers to avoid step coverage problems and improve manufacturing yield.

BRIEF SUMMARY OF THE INVENTION

The invention is related in the general area of generating integrated thin film Lange couplers and other passive components along with associated interconnect. To date, the industry has been unable to commercially fabricate a viable integrated Lange coupler with repeatable high frequency performance characteristics and reliability in the thin film industry. The system and method described in the figures and the following text discloses such a system that can be fabricated using conventional thin film technologies at substantially reduced costs over methods currently used within the industry.

BRIEF DESCRIPTION OF THE DRAWINGS

For a fuller understanding of the advantages provided by the invention, reference should be made to the following detailed description together with the accompanying drawings wherein:

FIG. 8A illustrates a sectional top view for illustration of the process for forming integrated capacitors and interconnects on a substrate similar to FIG. 7A;

FIG. 8B illustrates a step of forming contact holes (0806) to the lower electrodes and interconnects;

DESCRIPTION OF THE PRESENTLY PREFERRED EXEMPLARY EMBODIMENTS

Embodiments are Exemplary

Figure 1A:
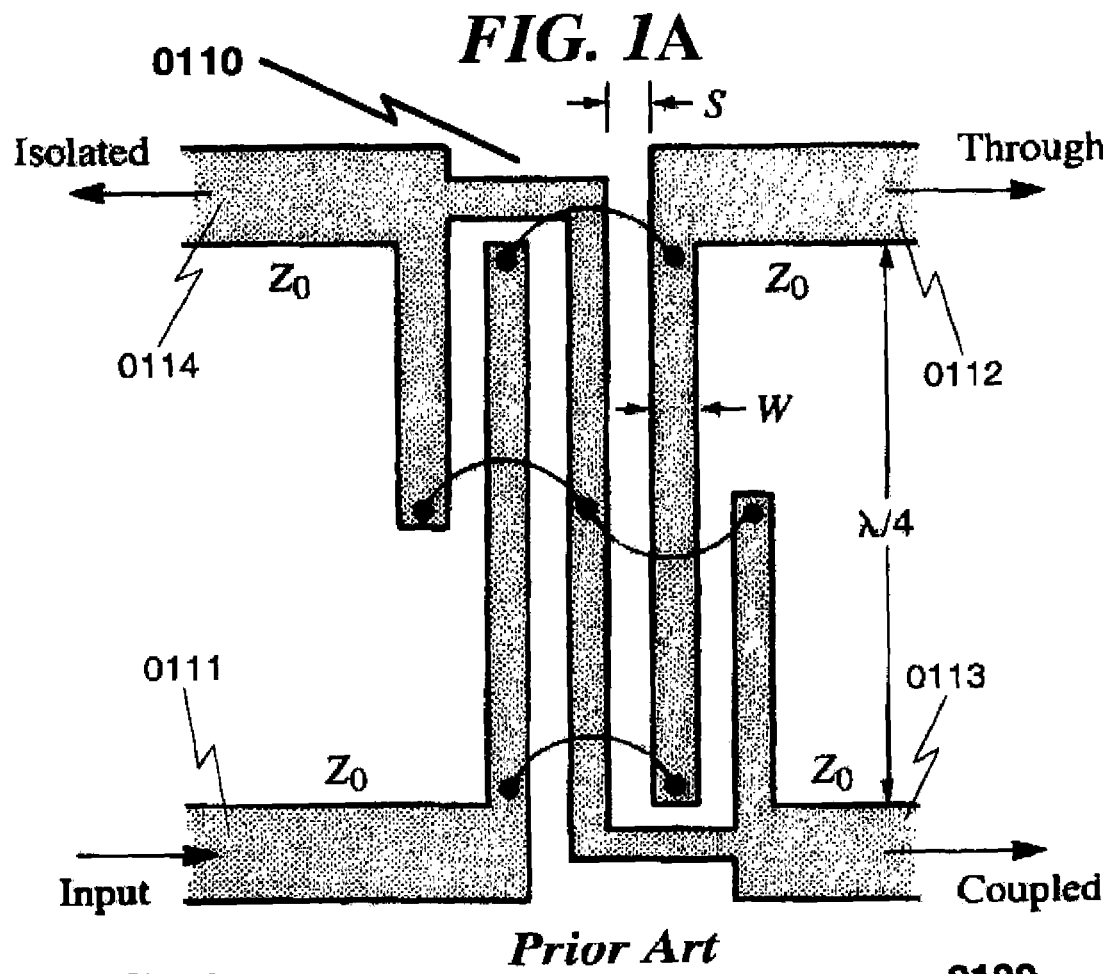
FIG. 1 illustrates prior art Lange coupler structures.

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiments, wherein these innovative teachings are advantageously applied to the particular problems of an LANGE COUPLER SYSTEM AND METHOD. However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and visa versa with no loss of generality.

System Construction (0500, 0600, 0700, 0800, 0900, 1000)

Referring to the system as described in FIGS. 3-10 (0500, 0600, 0700, 0800, 0900, 1000) and method as described in FIG. 15 (1600), a substrate and method for forming same containing integrated Lange couplers, capacitors, inductors and/or interconnects along with conductors and/or resistors will now be described.

[1] Metalization (1601)

Figure 3:
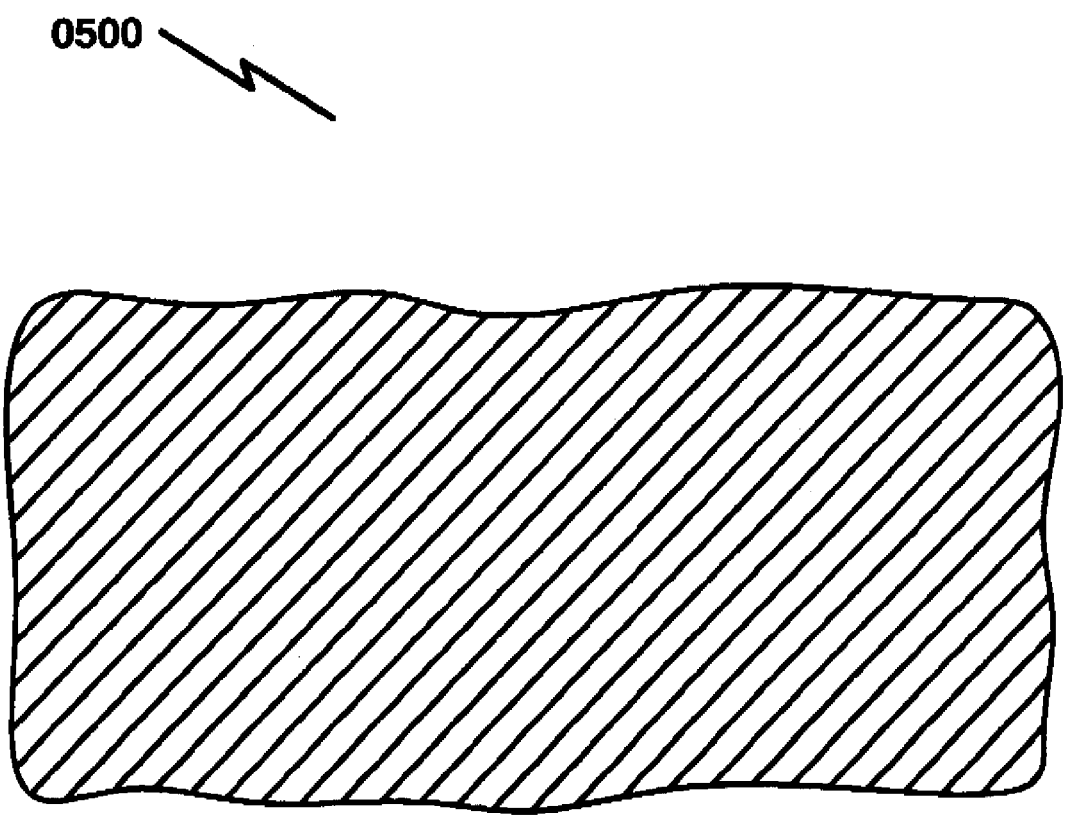
FIG. 3 illustrates a sectional top view for illustration of the process for forming integrated capacitors and interconnects on a substrate (0501) according to the present invention.
Figure 4:
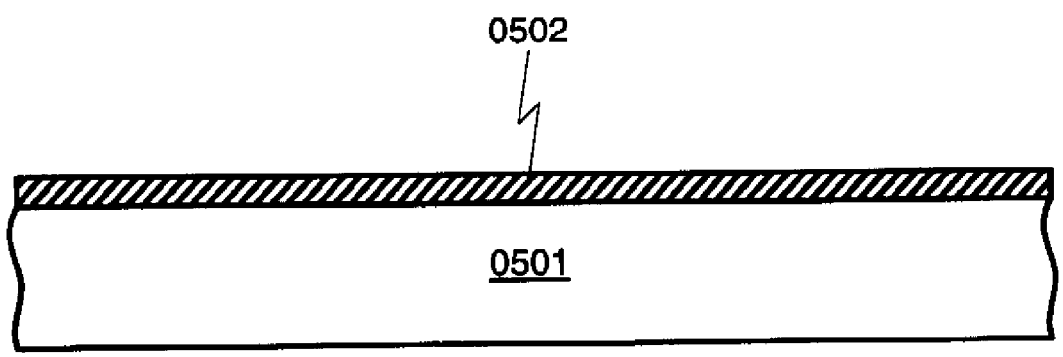
FIG. 4 illustrates the step of metalizing (0502) the substrate (0501) with the lower electrode and interconnect layer (0502)
Figure 5:
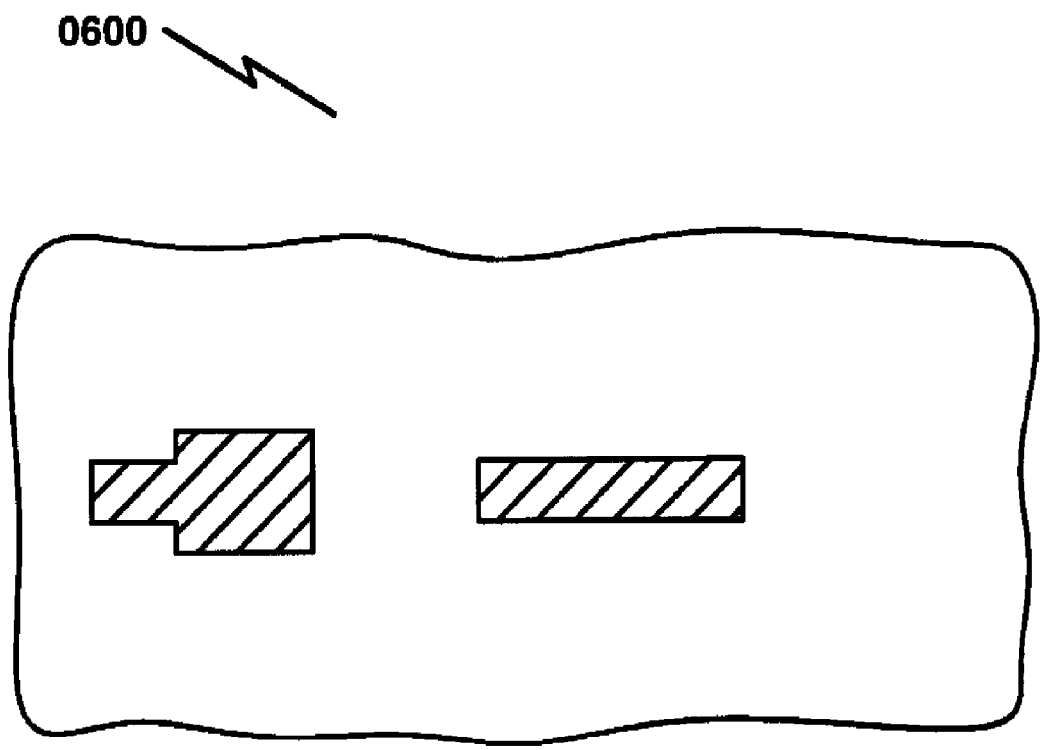
FIG. 5 illustrates a sectional top view for illustration of the process for forming integrated capacitors and interconnects on a substrate similar to FIG. 3.

As shown in FIG. 3 and FIG. 4 (0500), a substrate (0501) is metalized (0502) on one or both sides by sputtering, evaporation, or chemical vapor deposition (1601).

This metalized layer (0502) is typically formed of a lower adhesive layer and an upper conducting layer. Key to the success of the present invention is keeping the total thickness of this metalized layer (0502) at or below approximately 1.50 µm. The prior art universally teaches the use of base metalization layers on the order of 2-4 µm in thickness that makes step coverage difficult in all known Lange coupler and capacitor/inductor/interconnect fabrication processes. The present invention breaks with this methodology and utilizes a much thinner adhesive/conducting layer combination to achieve reliable step coverage and superior passive component performance.

The lower adhesive layer is generally very thin (~0.03-0.05 µm) and is optimally comprised of chromium (Cr), titanium (Ti), or titanium-tungsten (WTi), although other adhesive conducting materials are also known in the art. The purpose of this layer is to generally act as a bonding interface between the substrate (0501) and the conducting layer (0502).

The upper conducting layer is generally thicker (approximately 0.25 μm to approximately 1.40 μm in thickness, limited only by the total thickness of 1.5 μm of the metalized layer (0502) described above) than the lower adhesive layer and may be comprised of any of a wide variety of metals, but preferred embodiments utilize gold (Au), copper (Cu), aluminum (Al), silver (Ag), tantalum (Ta), tungsten (W), titanium (Ti), nickel (Ni), molybdenum (Mo), platinum (Pt), and/or palladium (Pd). The combination of the lower adhesive layer and upper conducting layer serves as the bottom electrode layer (0502) used to form electrical conducting "bridges" for Lange coupler structures.

[2] Align/Expose/Etch Lower Electrodes (1602)

Figure 6:
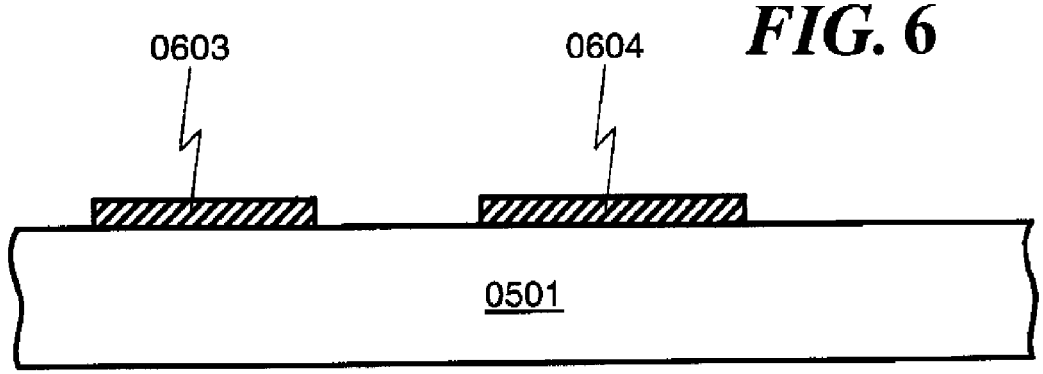
FIG. 6 illustrates a step of forming the individual lower electrodes (0603) for the capacitors and the interconnects (0604)

A photoresist (not shown) is then applied, imaged, and the substrate etched (1602) to form the desired patterns for Lange coupler electrical bridges and the lower electrodes of the capacitors (0603) and any interconnects (0604), as shown in FIG. 6 (0600).

[3] Apply Dielectric Layer (1603)

Figure 7A:
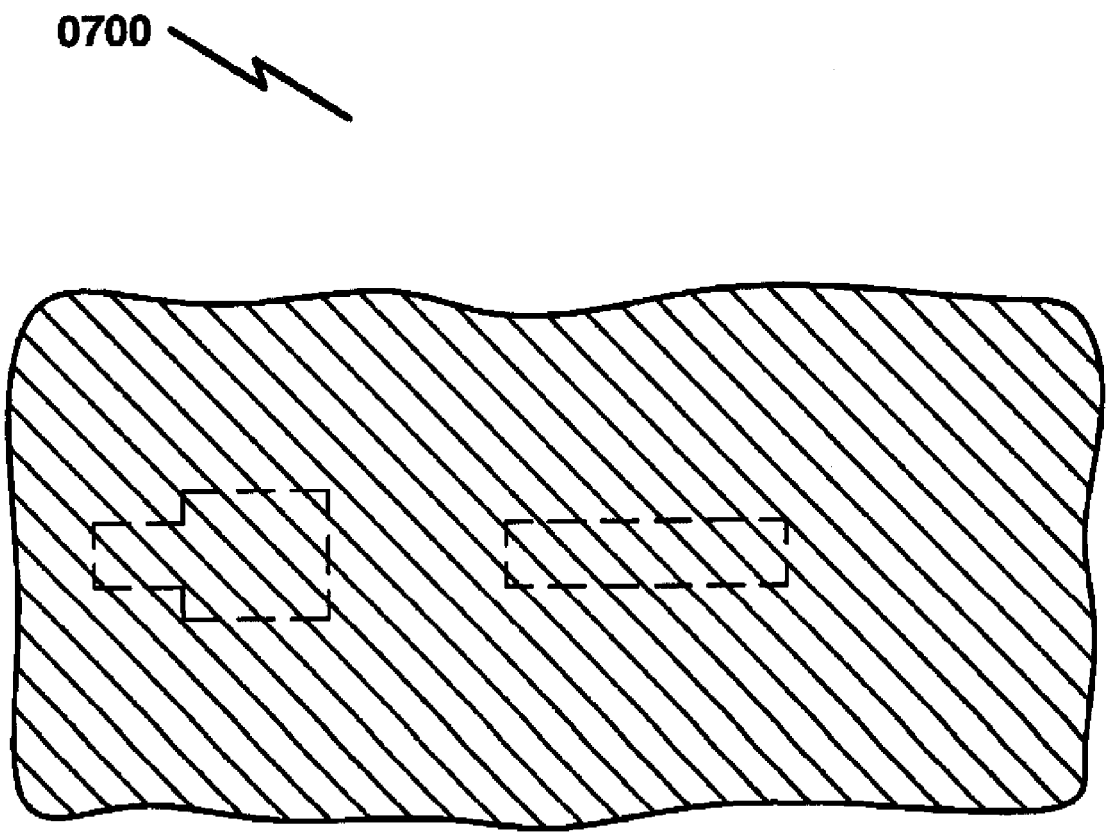
FIG. 7A illustrates a sectional top view for illustration of the process for forming integrated capacitors and interconnects on a substrate similar to FIG. 5.
Figure 7B:
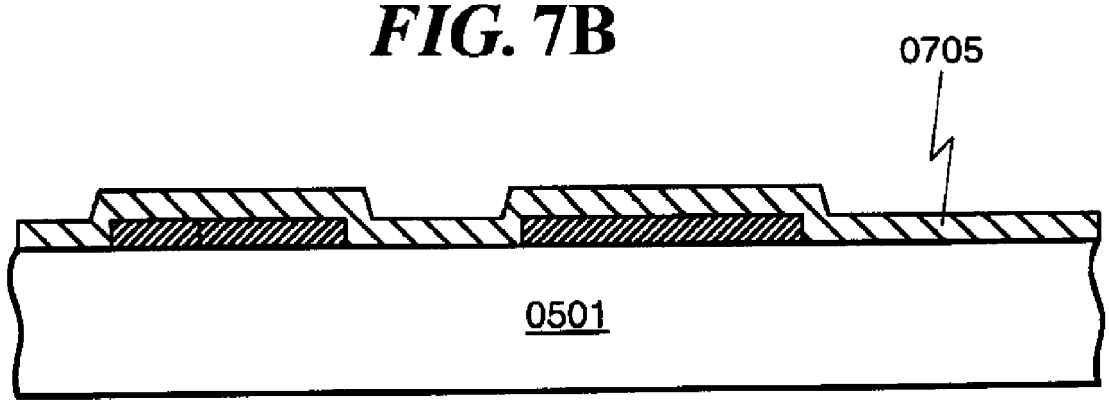
FIG. 7B illustrates a step of applying the dielectric layer (0705) on top of the patterned individual lower electrodes and the interconnects.

Then, as shown in FIG. 7A and FIG. 7B (0700), the dielectric layer of silicon nitride (0.3-2.0 μm) (0705) is applied to the entire substrate (0501) surface by chemical vapor deposition techniques (CVD or PECVD) (1603). One skilled in the art will recognize that other dielectric layer materials are possible. While silicon nitride is a preferred dielectric, a wide variety of other materials are anticipated by the present invention and detailed later in this document.

[4] Align/Expose/Etch Contact Holes (1604)

Thereafter, as shown in FIG. 8A and FIG. 8B (0800), a photoresist (not shown) is applied, imaged, and the substrate is plasma etched (1604) to form the contact holes (0806) in the dielectric layer (0705) in order to be able to make electrical contact to the Lange coupler electrical bridges and lower electrodes of the capacitors (0603) and the interconnect (0604).

Note also that in many applications it will be advantageous to selectively pattern the dielectric layer to remove certain portions of dielectric under the upper level metalization. This optional selective patterning can easily be accomplished in this same step. Rationales for this selective patterning procedure may be associated with improving the electrical performance of various capacitor/inductor/interconnect/resistor components, as one skilled in the art will readily recognize.

[5] Metalize Substrate to Make Contact With Lower Electrodes (1605)

Figure 9A:
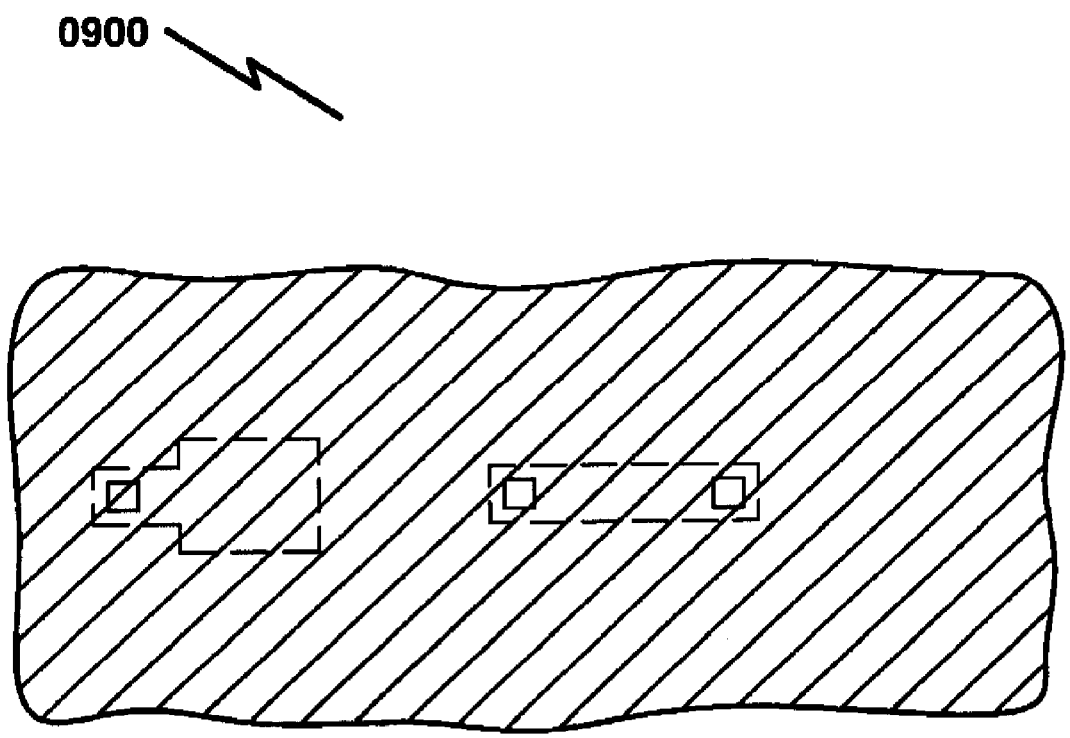
FIG. 9A illustrates a sectional top view for illustration of the process for forming integrated capacitors and interconnects on a substrate similar to FIG. 8A.
Figure 9B:
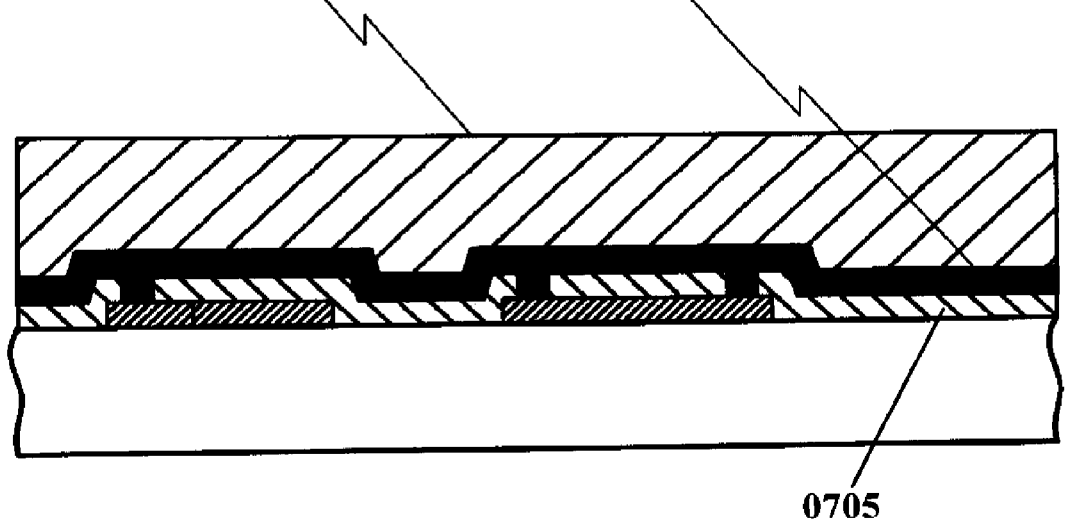
FIG. 9B illustrates a step of metalizing the top of the dielectric layer (0705) with the conductor (0907, 0908) and optional resistor layers.

FIG. 9A and FIG. 9B (0900) show that the substrate is then metalized with the upper electrode metal layers by sputtering, evaporation, chemical vapor deposition, and/or electroplating (1605). These metal layers (0907, 0908) are commonly tantalum nitride (to serve as the resistor layer) under WTi (0.05 μm) (0907) under Au (2-5 μm) (0908). These metal layers can be applied and patterned using etchback, plate-up, or lift-off techniques and make contact to the Lange coupler electrical brides and lower electrode and interconnect patterns through the contact holes.

[6] Align/Expose/Etch Upper Electrode/Inductor/Conductor (1606)

Figure 10A:
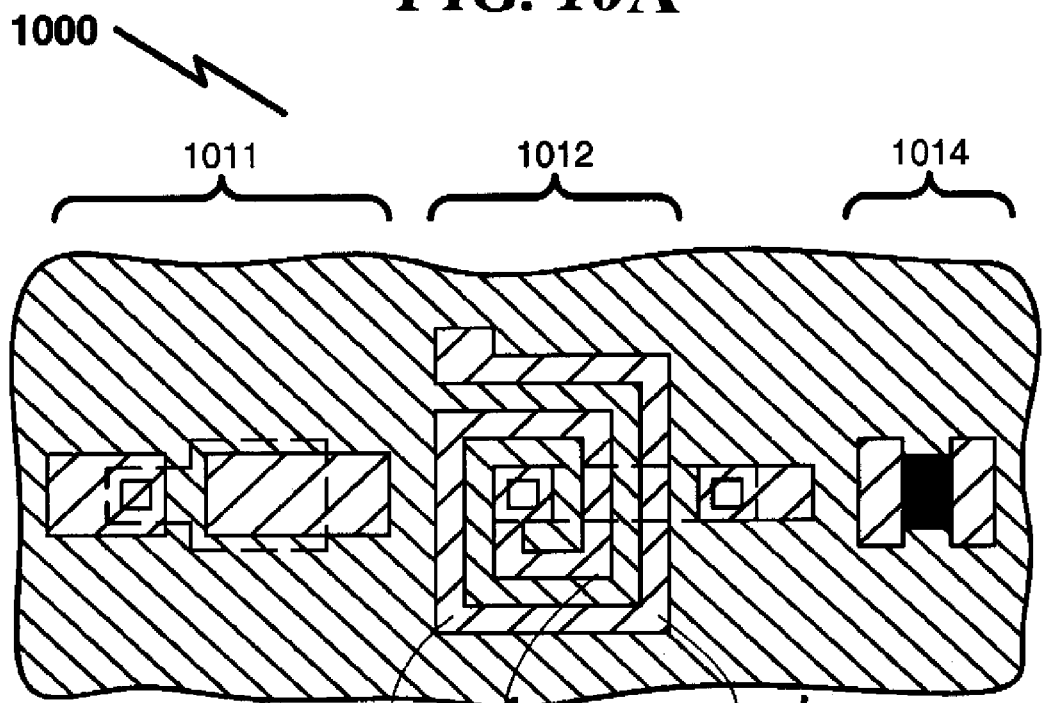
FIG. 10A illustrates a sectional top view for illustration of the process for forming integrated capacitors and interconnects on a substrate similar to FIG. 9A.
Figure 10B:
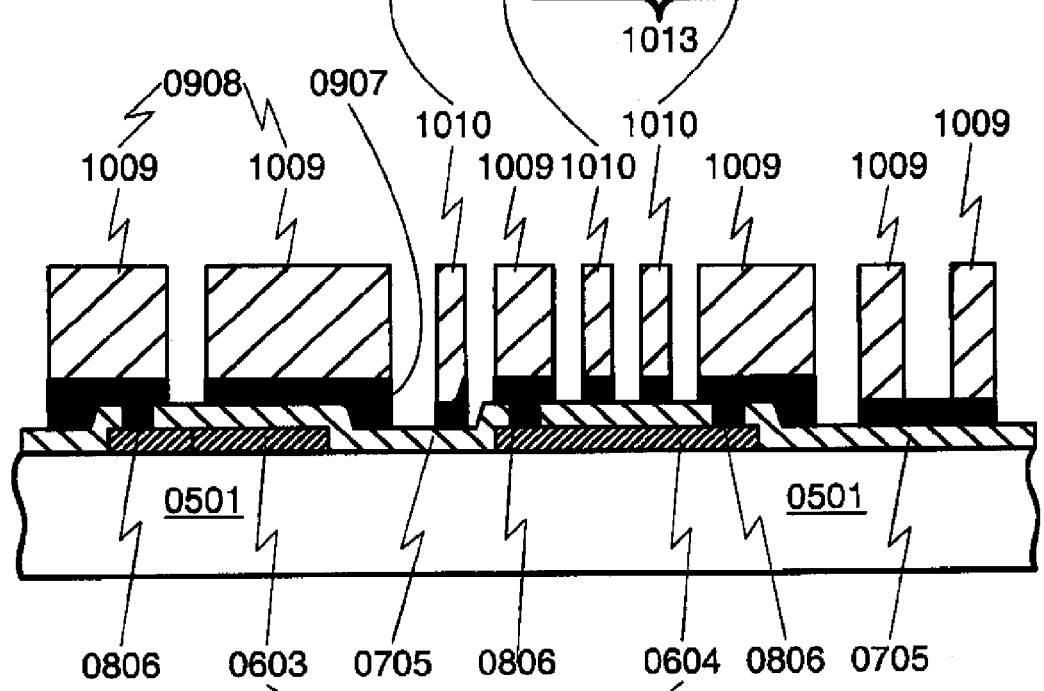
FIG. 10B illustrates a step of patterning the conductor layer with the individual upper electrodes (1009), capacitors (1011), spiral inductors (1012), interconnect (1013), and optional resistor elements (1014)

Thereupon, as shown in FIG. 10A and 10B (1000), photoresist (not shown) is applied, imaged, and the substrate is etched (1606) to form the Lange coupler interdigitated fingers, conductor layer features, upper electrode pads (1009), and optional spiral inductors (1010). One skilled in the art will recognize that a wide variety of spiral inductor geometries are possible using the teachings of the present invention, and are not limited to the specific spiral inductor illustrated (1010).

[7] Optionally Form Resistor Elements (1607)

In FIG. 10B (1000) the resistor elements (1014) are optionally formed by applying photoresist (not shown), imaging the photoresist, and then etching the resistor layer (1607).

Construction Variations

From the foregoing, it will be understood by one skilled in the art that according to the present invention a lower electrode and interconnect layer formed using a high conductivity material such as Au, Ag, Cu, or Al will offer excellent high frequency characteristics.

It will be further understood that according to the present invention the dielectric material and thickness can be chosen to optimize capacitance values and/or breakdown voltage.

It will be further understood that according to the present invention to integrate capacitors and interconnects on a variety of thin film hybrid substrates and surface finishes along with conductors, inductors, and resistor elements.

Summary

In summary, it will be understood by one skilled in the art that according to the present invention it becomes possible to integrate Lange couplers, capacitors, inductors, and/or interconnects on a thin film hybrid substrate along with conductors and/or resistor elements in a wide variety of configurations.

System Embodiments (1100, 1200, 1300)

Figure 11:
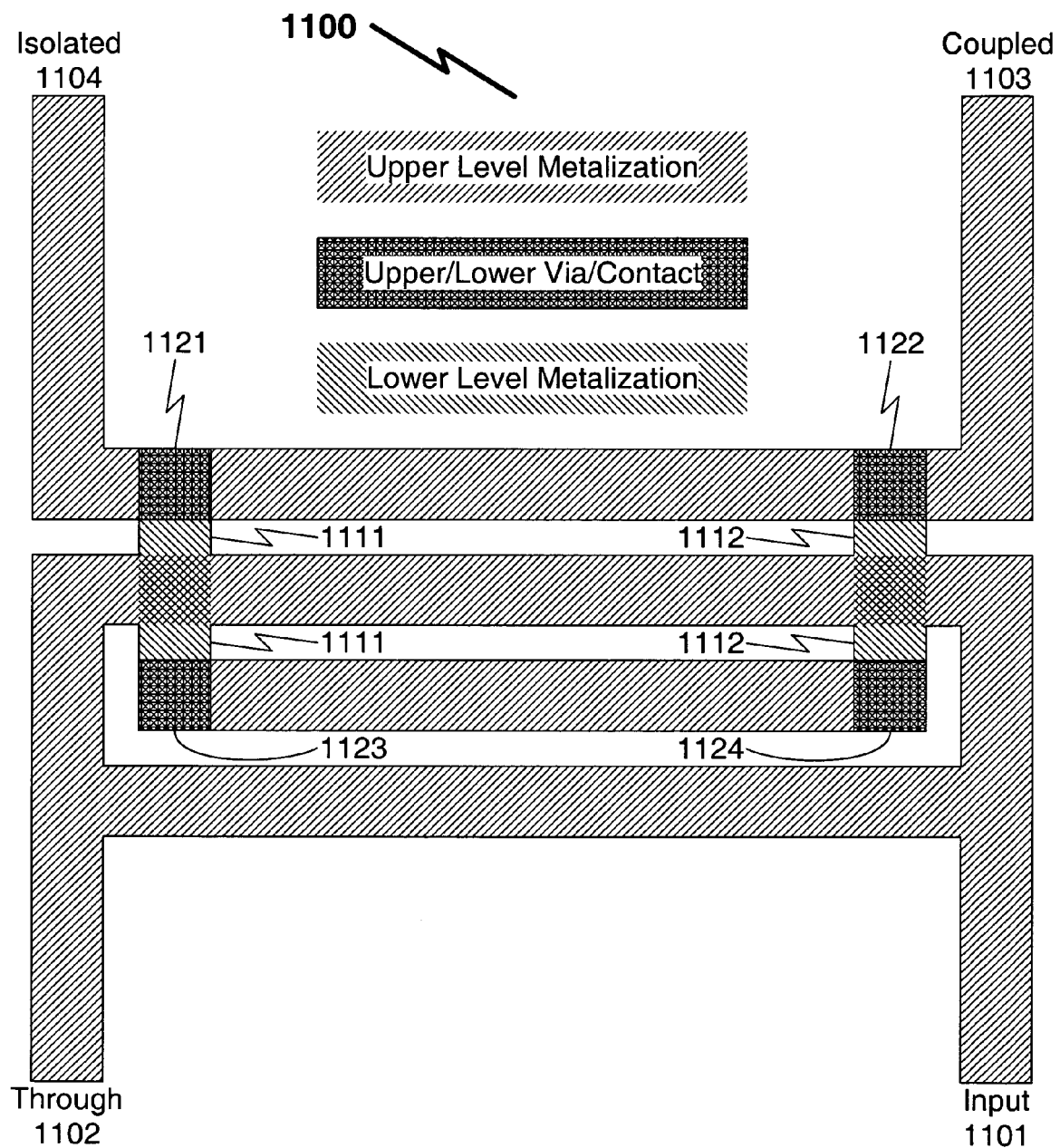
FIG. 11 illustrates an exemplary unfolded Lange coupler structure using the teachings of the present invention.
Figure 12:
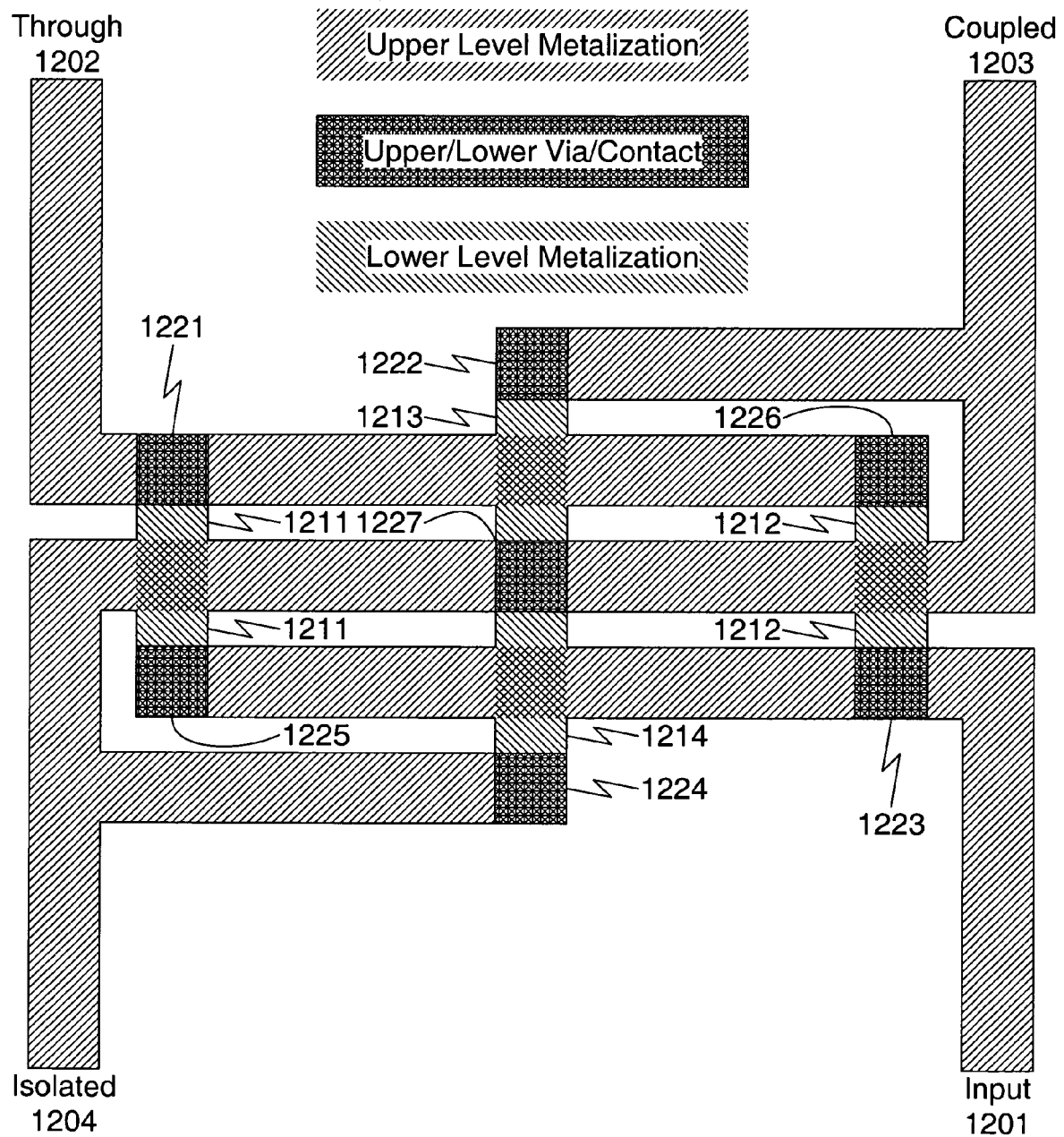
FIG. 12 illustrates an exemplary Lange coupler structure using the teachings of the present invention.

The present invention can be generally illustrated as applied specifically to Lange couplers as illustrated in FIGS. 11-12 (1100, 1200) and will now be described in detail.

Uncoupled Lange Coupler (1100)

Referencing the uncoupled Lange coupler structure of FIG. 11 (1100), the present invention teaches a general Lange coupler structure comprising INPUT (1101), THROUGH (1102), COUPLED (1103), and ISOLATED (1104) ports. These port structures (1101, 1102, 1103, 1104) are formed on upper level metallization, while the cross bridges (1111, 1112) are formed on lower level metallization with corresponding upper/lower level metallization via/contacts (1121, 1122, 1123, 1124).

Figure 1B:
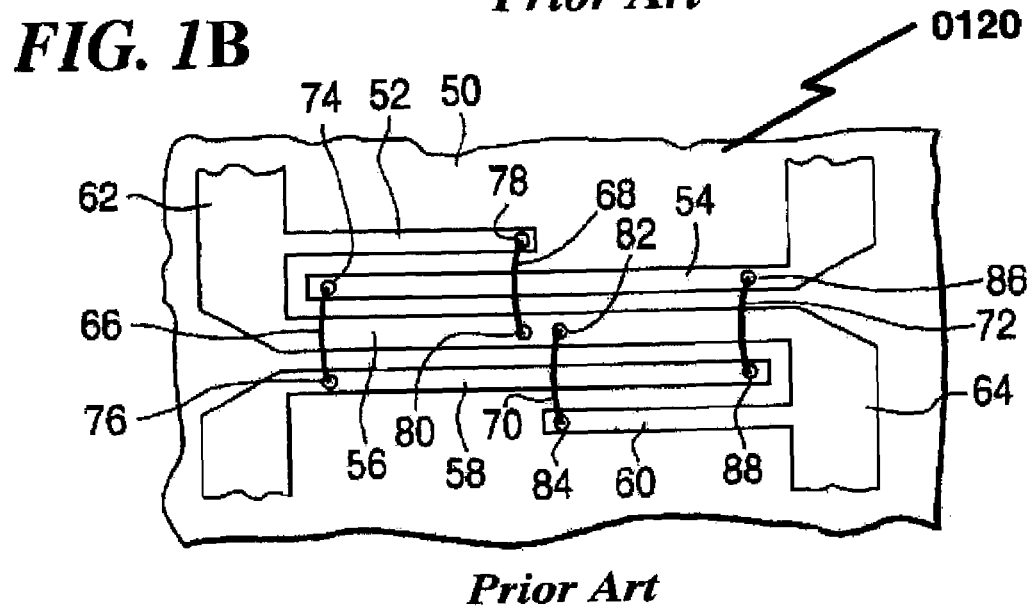
Figure 2:
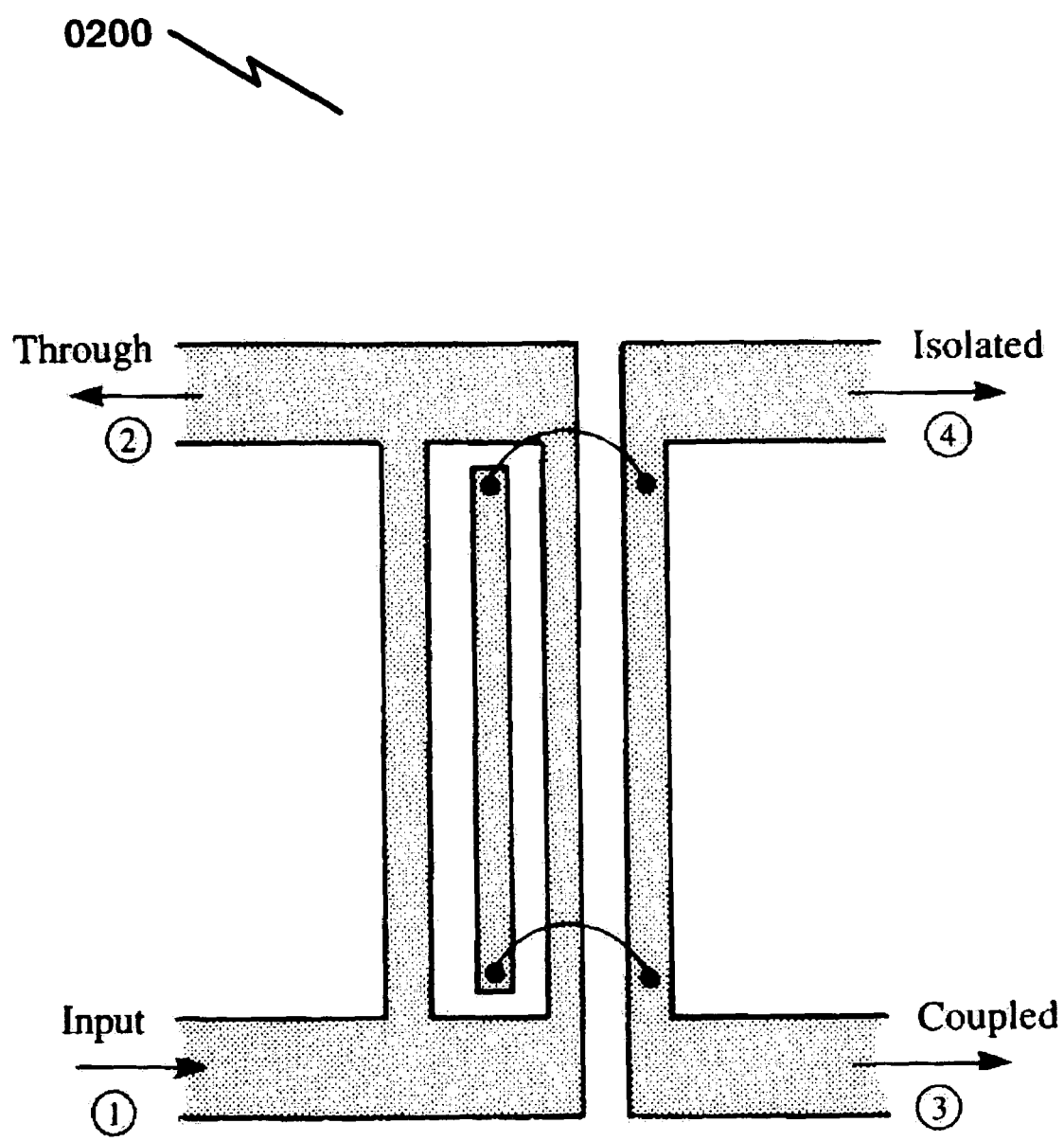
FIG. 2 illustrates a prior art unfolded Lange coupler structure.

This structure differs significantly from the prior art illustrated in FIGS. 1-2 in that the present invention teaches that the cross bridge interconnects are formed on lower level metallization as opposed to upper level metallization as in the prior art. Significantly, as indicated in FIG. 3 (0500), the lower metallization layer (0502) utilized in formation of the present invention Lange coupler structure is typically formed of a lower adhesive layer and an upper conducting layer.

Key to the success of the present invention is keeping the total thickness of this metalized layer (0502) at or below approximately 1.50 μm. This permits elimination of step coverage problems normally associated with the fabrication of conventional Lange coupler structures as well as drastic improvement of reliability over prior art Lange coupler structures incorporating wire bonding over-bridge interconnects.

Conventional Lange Coupler (1200)

Referencing the conventional Lange coupler structure of FIG. 12 (1200), the present invention teaches a general Lange coupler structure comprising INPUT (1201), THROUGH (1202), COUPLED (1203), and ISOLATED (1204) ports. These port structures (1201, 1202, 1203, 1204) are formed on upper level metallization, while the cross bridges (1211, 1212, 1213, 1214) are formed on lower level metallization with corresponding upper/lower level metallization via/contacts (1221, 1222, 1223, 1224, 1225, 1226, 1227).

This structure differs significantly from the prior art illustrated in FIGS. 1-2 in that the present invention teaches that the cross bridge interconnects are formed on lower level metallization as opposed to upper level metallization as in the prior art. Significantly, as indicated in FIG. 3 (0500), the lower metallization layer (0502) utilized in formation of the present invention Lange coupler structure is typically formed of a lower adhesive layer and an upper conducting layer.

Key to the success of the present invention is keeping the total thickness of this metalized layer (0502) at or below approximately 1.50 μm. This permits elimination of step coverage problems normally associated with the fabrication of conventional Lange coupler structures as well as drastic improvement of reliability over prior art Lange coupler structures incorporating wire bonding over-bridge interconnects.

Method (1600)

Figure 15:
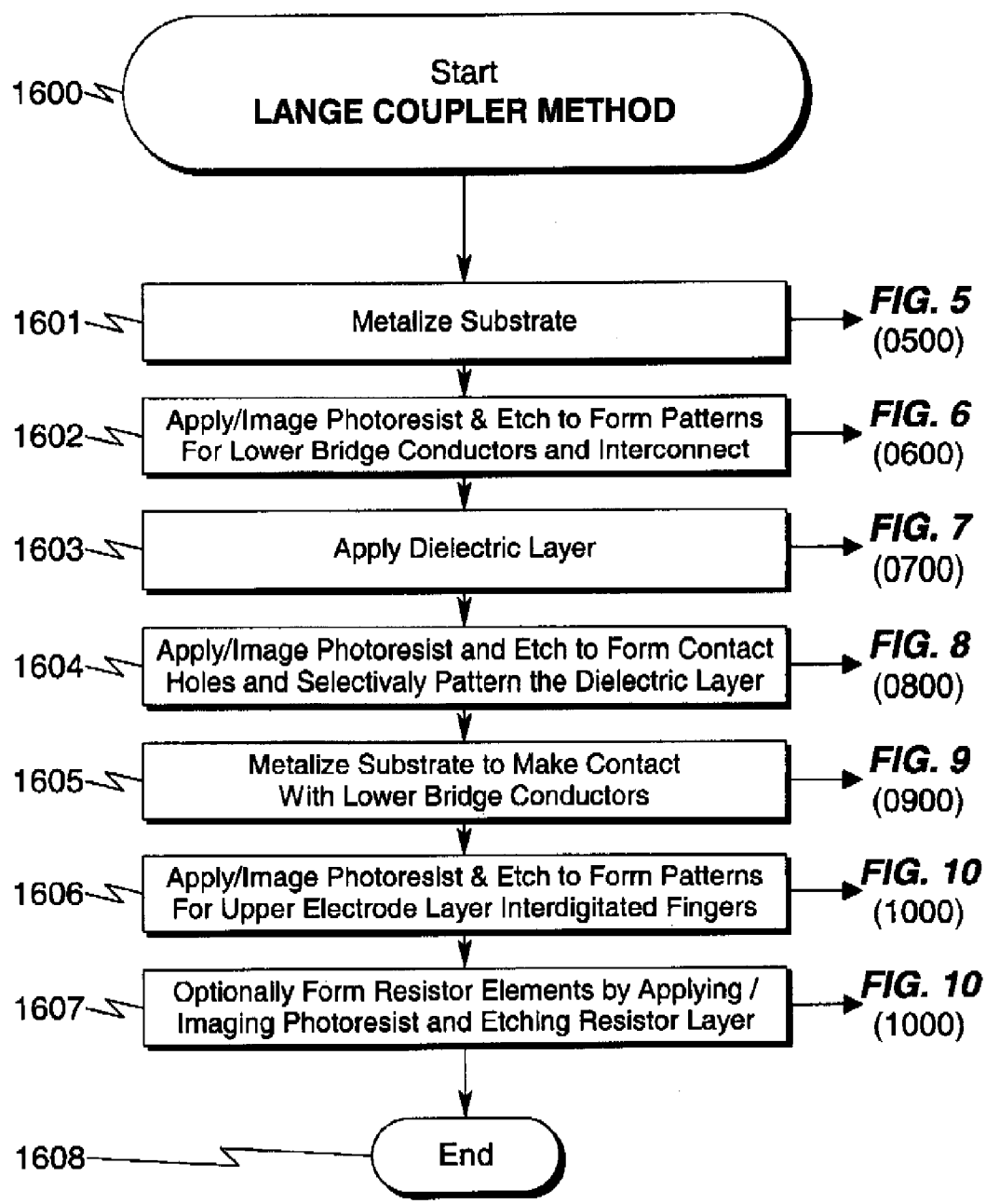
FIG. 15 illustrates an exemplary process flowchart that implements a fabrication method taught by the present invention.

As described previously, the exemplary method used to fabricate the Lange coupler of the present invention is illustrated in FIG. 15 (1600) and is summarized in the following steps:
1. metalize the substrate with a thin metal overcoat (1601);
2. align/image photoresist and etching to form patterns for lower Lange coupler bridge conductors and capacitor electrodes and interconnect (1602);
3. apply the thin dielectric layer (1603);
4. apply/image the photoresist and etch to form contact holes (1604);
5. metalize substrate to make contact with lower electrodes (1605);
6. apply/image photoresist and etch to form patterns for Lange coupler interdigitated fingers and conductor/inductor layer and upper electrode (1606); and
7. optionally form resistor elements by applying/imaging photoresist and etching resistor layer (1607).

Key to this process is the thin application of metalization in step (1) to allow the use of a thin dielectric layer in step (2) to minimize the impact of step coverage reliability problems that are present in the prior art.

System/Method Variations

Material Variations

The present invention is amenable to a wide variety of system/method variations, some of which include the following:
1. The lower electrode and interconnect layer may be comprised of materials that are mainly gold (Au), copper (Cu), silver (Ag), aluminum (Al).
2. The lower electrode and interconnect layer may be comprised of materials that are made of one or more metals selected from a group consisting of tantalum (Ta), tungsten (W), titanium (Ti), nickel (Ni), molybdenum (Mo), platinum (Pt), palladium (Pd), or chromium (Cr).
3. The dielectric layer may be comprised of materials that are made of a material that is mainly silicon nitride ($Si_3N_4$), silicon dioxide ($SiO_2$), silicon oxynitride ($SiO_xN_x$), aluminum oxide ($Al_2O_3$), or tantalum pentoxide ($Ta_2O_5$).
4. The dielectric layer may be comprised of materials that that consists of a ferroelectric material that is mainly $BaTiO_3$, $SrTiO_3$, $BaTiO_3$, $PbZrO_3$, $PbTiO_3$, $LiNbO_3$, or $Bi_{14}Ti_3O_{12}$.
5. The dielectric layer may be comprised of a material that is mainly polyimide or benzocyclobutene.
6. The substrate may be comprised of materials that are selected from a group consisting of alumina ($Al_2O_3$), beryllium oxide (BeO), fused silica ($SiO_2$), aluminum nitride (AlN), sapphire ($Al_2O_3$), ferrite, diamond, LTCC, or glass.

Note that while these variations constitute preferred embodiments of the present invention, they are not limitive of the teachings of the present invention.

Product By Process

Referring to the system as described in FIGS. 3-10 (0500, 0600, 0700, 0800, 0900, 1000) and method as described in FIG. 15 (1600), the resulting product containing integrated capacitors, inductors and/or interconnects along with conductors and/or resistors will now be discussed.

What is significant to note about the individual capacitors, inductors, and interconnect (fabricated using the method illustrated herein and for which an exemplary flowchart is given in FIG. 15 (1600)), is that the electrical characteristics of these components are superior to that possible with the prior art. This difference in kind is possible because:
1. The parasitic inductance associated with the capacitors formed using the teachings of the present invention is necessarily lower than that of the prior art. This is because the length of interconnect required to actually connect the capacitor to the remainder of the hybrid circuit need not use crossover spans as in the prior art. These crossover spans tend to add parasitic capacitance that reduces the self-resonant frequency of the capacitor.
2. Additionally, the parasitic resistance of the capacitor structures is reduced as compared to the prior art because crossover spans and additional interconnect required by the prior art has a finite resistance which reduces the quality factor (Q) of the capacitor structure. This parasitic resistance is well known by one skilled in the art as "effective series resistance" and is necessarily a degradation of device performance.
3. The parasitic capacitance associated with the inductors and interconnect using the teachings of the present invention is significantly lower than that of the prior art. This is in part because the prior art has difficulty in controlling the dielectric thickness of the sidewalls of the upper layer conducting layers.
4. The present invention has significantly better reliability and manufacturability because of the improvement in step coverage as compared to the prior art. The potential for sidewall punchthrough or shorting is a significant drawback of the prior art. This potential defect reduces manufacturing yields, causes failures in the field, and generally increases the final cost of the manufactured hybrid system.
5. Note that since the reliability of a system containing multiple capacitors, inductors, and interconnects is determined by the weakest link in the system, an large array of hybrid components having poor individual reliability drastically increases the cost of the overall system because of the reduced overall system reliability.
6. Note that in space-constrained designs and also high performance designs, the ability to overlap ground contact vias (1104) with an overlapping capacitor structure increased the area efficiency and high frequency performance of bypass/decoupling/filtering capacitor structures. This is a significant performance improvement over the prior art.

One skilled in the art will no doubt observe other advantages to the present invention as compared to the prior art.

Exemplary System Applications

Overview

While a wide variety of system applications are amenable to use of the present invention, several are preferred and will now be discussed. Discussion of these applications in no way limits the scope of the present invention.

Lange Coupler Structure Not Limitive (1400, 1500)

Figure 14A:
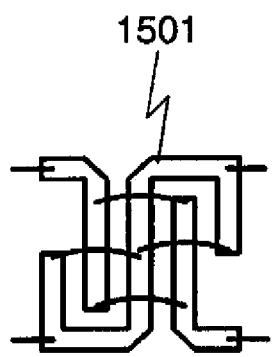
FIGS. 14A-14C illustrate a variety of exemplary Lange coupler structure topologies illustrating some possible variants of topologies for the present invention.
Figure 14B:
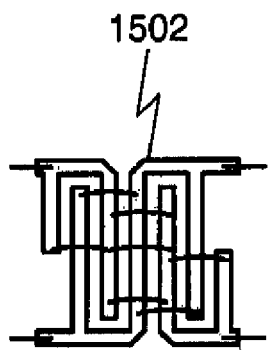
Figure 14C:
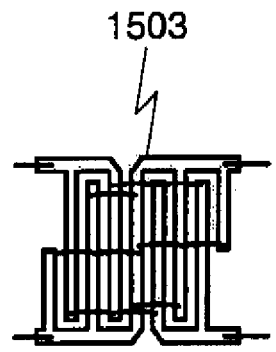

The four port interdigitated Lange coupler structure developed by Dr. Julius Lange around 1969 is widely used as a power combiner and splitter in RF amplifiers as well as mixers and modulators. The ports on this prototypical Lange coupler structure are generally termed INPUT PORT, THROUGH PORT, COUPLED PORT, and ISOLATED PORT. The general structure of this device permits coupling derived from closely spaced transmission lines, such as microstrip lines. Typically the number of conductors or fingers (N) is even. Geometries of N=6 (1401), N=6 (1402), and N=4 (1403) are generally illustrated in FIG. 14 (1400) and additional examples of N=4 (1501), N=6 (1502), and N=8 (1503) are shown in FIG. 15 (1500). The length of the fingers is set by the desired center frequency (Fo) of the filter. The device is relatively broadband, with flat frequency response (Fo). The finger length is equal to the quarter wavelength of Fo in the substrate.

Figures 13A, 13B, 13C:
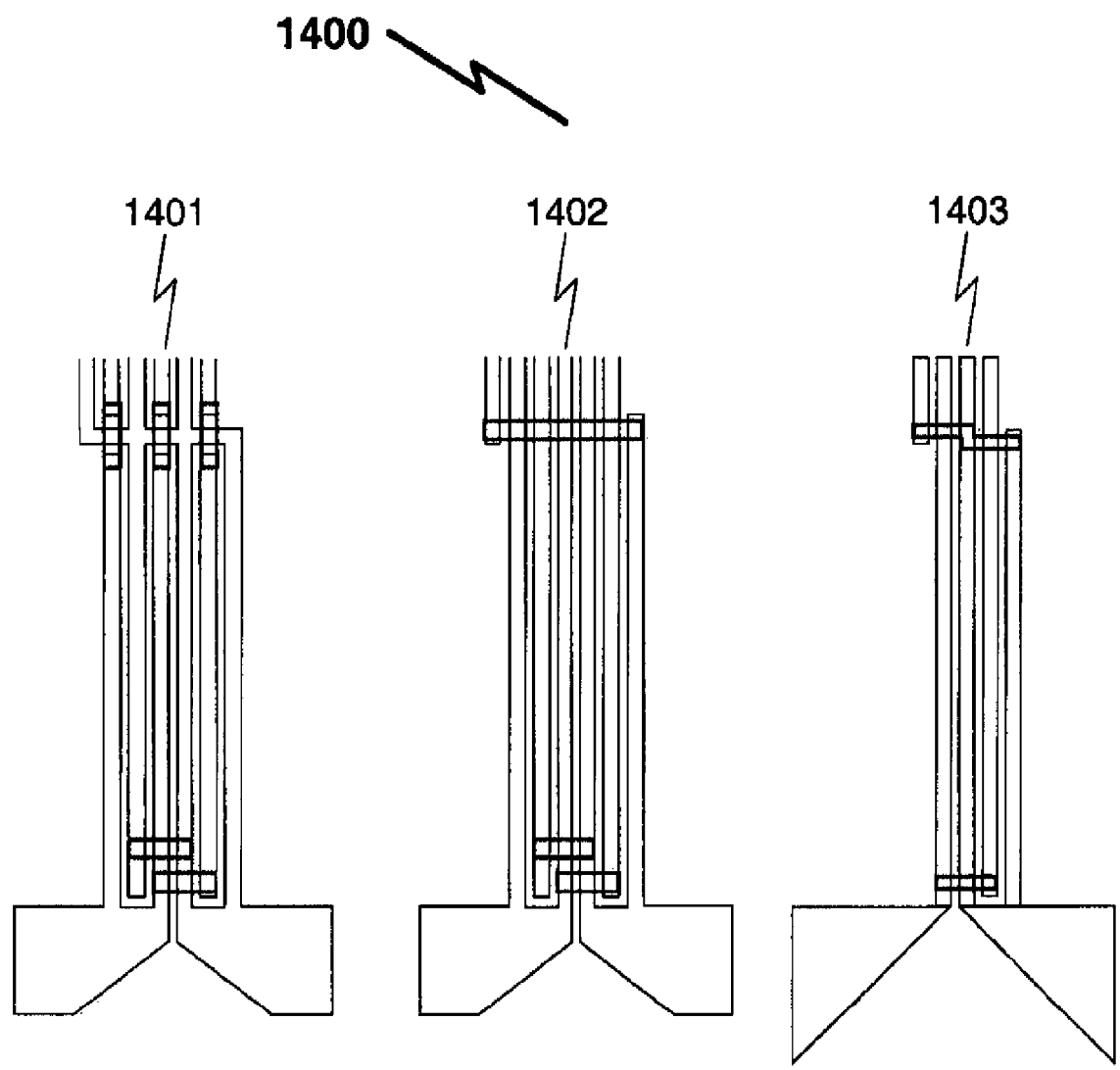
FIGS. 13A-13C illustrate a variety of exemplary Lange coupler structure topologies illustrating some possible variants of topologies for the present invention.

The present invention teaches an improved structure for Lange couplers as applied to thin film hybrid microelectronic substrates. The present invention does not limit the scope of the term "Lange coupler structure" to the geometric structures illustrated in FIGS. 1-2. The Lange coupler structure concept as illustrated in these figures provides for sets of "interdigitated fingers" which are then "bridged" by some electrical connecting means. As illustrated by the exemplary topologies in FIG. 13 (1401, 1402, 1403) and FIG. 14 (1501, 1502, 1503), the number of interdigitated fingers and the number of crossovers may vary widely with the implementation of the particular Lange coupler design without diverging from the teachings of the present invention. The term "Lange coupler structure" is deemed to include any of these geometric topologies consistent with the teachings of the present invention as described herein.

The present invention provides for an improved methodology of implementing the "bridges" between the "interdigitated fingers" by providing a method of accomplishing the electrical connecting means that is both easier to manufacturer as well as providing a higher reliability level than prior art connecting means. The present invention specifically teaches than the "bridges" may be constructed using a metalized "bridge" that is formed below the main "interdigitated fingers", comprising a lower adhesive layer and an upper conducting layer. Key to the success of the present invention is keeping the total thickness of this metalized bridge layer at or below approximately 1.50 μm.

Thus, the present invention teaches that any conventional Lange coupler structure can be constructed using lower metalized crossover bridges comprising a lower adhesive layer and an upper conducting layer having a sum total thickness at or below approximately 1.50 μm. After dielectric application and patterning, the "interdigitated fingers" of the Lange coupler are patterned in top level metal and connected to the lower level bridge metallization with the use of vias and/or contacts penetrating the dielectric layer.

Exemplary System Modifications

Intermediary Adhesion Layer(s)

The present invention anticipates system augmentation in a variety of ways to improve performance and/or reliability via the use of one or more intermediary adhesion layers. As indicated in FIG. 3 (0500), the metallization layer (0502) is typically formed of a lower adhesive layer and an upper conducting layer. Key to the success of the present invention is keeping the total thickness of this metalized layer (0502) at or below approximately 1.50 μm.

To improve overall reliability between the upper conducting layer and subsequent layers (such as silicon nitride), it is often advantageous to incorporate a tungsten-titanium (WTi) or other top adhesion (adhesive) layer on top of the bottom electrode upper conducting layer. This additional adhesion layer in many circumstances prevents the silicon nitride (or other topical layer) from cracking and delaminating from the bottom electrode upper conducting layer when the system is exposed to heat and/or stress. One skilled in the art will recognize that substitutions for the silicon nitride layer and/or the titanium-tungsten (WTi) adhesion layer (such as chromium (Cr) or titanium (Ti)) can be made with no loss of generality in the teachings of the present invention.

CONCLUSION

A system and method for the fabrication of high reliability high performance Lange couplers (optionally including capacitors (1011), inductors (1012), multi-layer interconnects (1013), and resistors (1014)) on various thin film hybrid substrate surfaces (0501) has been disclosed.

The disclosed Lange coupler method first employs a thin metal layer (0502) deposited and patterned on the substrate (0501). This thin patterned layer (0502) is used to provide both lower electrodes for capacitor structures (0603) and interconnects (0604) between upper electrode components. Next, a dielectric layer (0705) is deposited over the thin patterned layer (0502) and the dielectric layer (0705) is patterned to open contact holes (0806) to the thin patterned layer. The upper electrode layers (0907, 0908, 1009, 1010) are then deposited and patterned on top of the dielectric (0705).

The resulting Lange coupler structure has significantly improved electrical performance over the prior art, while incorporating overall structural integrity superior to that of the prior art.

What is claimed is:

1. A Lange coupler system comprising:
    (a) a thin film hybrid substrate;
    (b) a lower bridge conductor, electrode, and interconnect layer formed on said thin film hybrid substrate, said layer further comprising a lower adhesive layer and an upper conducting layer having a sum total thickness less than or equal to 1.5 microns;
    (c) a dielectric layer deposited on top of the said patterned lower electrode and interconnect layer; and
    (d) an upper electrode layer further comprising interdigitated fingers formed on said dielectric layer;
    wherein
    said upper conducting layer is approximately 0.25-1.40 microns thick;
    said upper conducting layer forms electrical connections between said interdigitated fingers;

said interdigitated fingers when connected to said upper conducting layer form a Lange coupler structure.

2. The Lange coupler system of claim 1, wherein said lower adhesive layer is approximately 0.03 to 0.05 microns thick.

3. The Lange coupler system of claim 1, wherein said lower adhesive layer comprises chromium.

4. The Lange coupler system of claim 1, wherein said lower adhesive layer comprises titanium.

5. The Lange coupler system of claim 1, wherein said lower adhesive layer comprises titanium-tungsten.

6. The Lange coupler system of claim 1, wherein said upper conducting layer comprises silver.

7. The Lange coupler system of claim 1, wherein said upper conducting layer comprises aluminum.

8. The Lange coupler system of claim 1, wherein said upper conducting layer comprises gold.

9. The Lange coupler system of claim 1, wherein said upper conducting layer comprises copper.

10. The Lange coupler system of claim 1, wherein said lower electrode and interconnect layer further comprises silver.

11. The Lange coupler system of claim 1, wherein said lower electrode and interconnect layer further comprises aluminum.

12. The Lange coupler system of claim 1, wherein said lower electrode and interconnect layer further comprises gold.

13. The Lange coupler system of claim 1, wherein said lower electrode and interconnect layer further comprises copper.

14. The Lange coupler system of claim 1, wherein said lower electrode and interconnect layer is selected from the group consisting of tantalum, tungsten, titanium, nickel, molybdenum, platinum, palladium, and chromium.

15. The Lange coupler system of claim 1, wherein said dielectric layer is selectively patterned.

16. The Lange coupler system of claim 1, wherein said dielectric layer further comprises silicon nitride.

17. The Lange coupler system of claim 1, wherein said dielectric layer further comprises silicon dioxide.

18. The Lange coupler system of claim 1, wherein said dielectric layer further comprises silicon oxynitride.

19. The Lange coupler system of claim 1, wherein said dielectric layer further comprises aluminum oxide.

20. The Lange coupler system of claim 1, wherein said dielectric layer further comprises tantalum pentoxide.

21. The Lange coupler system of claim 1, wherein said dielectric layer further comprises a ferroelectric material.

22. The Lange coupler system of claim 21, wherein said ferroelectric material is $BaTiO_3$.

23. The Lange coupler system of claim 21, wherein said ferroelectric material is $SrTiO_3$.

24. The Lange coupler system of claim 21, wherein said ferroelectric material is $PbZrO_3$.

25. The Lange coupler system of claim 21, wherein said ferroelectric material is $PbTiO_3$.

26. The Lange coupler system of claim 21, wherein said ferroelectric material is $LiNbO_3$.

27. The Lange coupler system of claim 21, wherein said ferroelectric material is $Bi_{14}Ti_3O_{12}$.

28. The Lange coupler system of claim 1, wherein said dielectric layer further comprises polyimide.

29. The Lange coupler system of claim 1, wherein said dielectric layer further comprises benzocyclobutene.

30. The Lange coupler system of claim 1, wherein said substrate material is selected from the group consisting of alumina, beryllium oxide, fused silica, aluminum nitride, sapphire, ferrite, diamond, LTCC, and glass.

31. The Lange coupler system of claim 1, further comprising an adhesion layer on top of said upper conducting layer.

32. The Lange coupler system of claim 1, further comprising an adhesion layer comprising titanium-tungsten on top of said upper conducting layer.

33. The Lange coupler system of claim 1, further comprising an adhesion layer comprising chromium on top of said upper conducting layer.

34. The Lange coupler system of claim 1, further comprising an adhesion layer comprising titanium on top of said upper conducting layer.

* * * * *